(12) United States Patent
Bevk

(10) Patent No.: US 6,500,740 B1
(45) Date of Patent: Dec. 31, 2002

(54) PROCESS FOR FABRICATING SEMICONDUCTOR DEVICES IN WHICH THE DISTRIBUTION OF DOPANTS IS CONTROLLED

(75) Inventor: Joze Bevk, Summit, NJ (US)

(73) Assignee: Agere Systems Inc., Allentown, PA (US)

( * ) Notice: Subject to any disclaimer, the term of this patent is extended or adjusted under 35 U.S.C. 154(b) by 0 days.

(21) Appl. No.: 09/650,038

(22) Filed: Aug. 29, 2000

Related U.S. Application Data

(63) Continuation-in-part of application No. 08/902,044, filed on Jul. 29, 1997, now Pat. No. 6,406,952.
(60) Provisional application No. 60/052,440, filed on Jul. 14, 1997.

(51) Int. Cl.[7] .............................................. H01L 21/425
(52) U.S. Cl. ...................... 438/532; 438/238; 438/710; 438/782; 257/634
(58) Field of Search ................................ 438/532, 238, 438/782, 710; 257/634

(56) References Cited

U.S. PATENT DOCUMENTS 5,275,961 A * 1/1994 Smayling et al. ............. 437/41
5,548,159 A * 8/1996 Jeng ............................ 257/634
6,096,591 A * 8/2000 Gardner et al. .............. 438/238
6,214,748 B1 * 4/2001 Kobayashi et al. .......... 438/782

* cited by examiner

Primary Examiner—Richard Elms
Assistant Examiner—Pho M. Luu
(74) Attorney, Agent, or Firm—Lowenstein Sandler PC

(57) ABSTRACT

In accordance with the invention, a silicon gate field effect device is provided with improved control over the distribution of dopants by forming thin buried layer of oxide within the silicon gate. In essence, a silicon gate device is fabricated by the steps of forming a gate dielectric on a silicon substrate and forming a first layer of the silicon gate (amorphous or polycrystalline) on the dielectric. A thin layer of oxide is formed on the first gate layer, and a second silicon gate layer is formed on the oxide, producing a silicon gate containing a thin buried oxide layer. Dopants are then implanted through the second gate layer and the buried oxide, and the device is finished in a conventional manner. The buried oxide layer, acting as a sieve, maintains high dopant concentration near the interface between the gate and minimizes dopant outdiffusion through the gate.

24 Claims, 4 Drawing Sheets

PROCESS FOR FABRICATING SEMICONDUCTOR DEVICES IN WHICH THE DISTRIBUTION OF DOPANTS IS CONTROLLED

CROSS REFERENCE TO RELATED APPLICATIONS

This application is a continuation-in-part of U.S. Pat. application Ser. No. 08/902,044 filed by Joze Bevk on Jul. 29, 1997 and entitled "Process For Device Fabrication" now U.S. Pat. No. 6,406,752, Ser. No. 08/902,044, in turn, claims priority of Provisional Application No. 60/052,440, entitled "Process for Device Fabrication", filed Jul. 14, 1997.

FIELD OF THE INVENTION

The invention relates to fabrication of semiconductor devices such as integrated circuits.

BACKGROUND OF THE INVENTION

As semiconductor devices become smaller, methods for precisely controlling the distribution of dopants within them become increasingly important. Critical semiconductor devices, such as field effect transistors, are in large part defined by precise patterns of different dopants in semiconductor substrates. Changes in those patterns due to unwanted migration can deteriorate the operation and, indeed, the operability of such devices. As a consequence substantial efforts have been made to control the distribution of dopants. The fabrication of complementary metal oxide semiconductor integrated circuits (CMOS circuits) is illustrative.

A variety of applications utilize CMOS integrated circuits. Many CMOS integrated circuits contain a dual-gate structure, illustrated in part by FIG. 1. Typically, formation of a dual-gate structure begins by forming a gate dielectric region 108 over a silicon substrate 100 having an n-doped region 102 and a p-doped region 104, separated (isolated) by a field oxide 106. (A dielectric material is an electrically insulating material, i.e., a material having a resistivity of about $10^6$ ohm-cm or greater.) A polysilicon region 110 is typically deposited over the gate dielectric 108 and field dielectric 106. The portion of the polysilicon 110 overlying the n-doped region 102 is provided with a p-type dopant such as boron or $BF_2$, and the portion of the polysilicon 110 overlying the p-doped region 104 is provided with an n-type dopant such as phosphorus or arsenic. Such dual-gate CMOS configurations typically contain a refractory metal silicide layer 112 (or other metal layer) over the doped polysilicon, the refractory metal silicide acting to lower resistance in the gate structure and thereby improve device and circuit performance.

However, n-type and p-type dopants tend to diffuse more readily in refractory metal suicides than in polysilicon. Dopants thus tend to diffuse, for example, from a region of the polysilicon 110 overlying doped silicon region 102 into the silicide layer 112, laterally in the silicide layer 112, and then back into the polysilicon 110 at a region overlying the oppositely-doped region 104. Thus, n-type dopants move into a p-doped polysilicon region and vice versa. The phenomenon is referred to herein as cross-doping. Diffusion of these cross-dopants into the area of the polysilicon adjacent to the underlying gate dielectric causes undesirable shifts in threshold voltage, an important parameter in CMOS design and operation. Moreover, the problem of cross-doping is becoming more severe as the industry moves toward smaller CMOS devices, e.g., moving towards 0.18 µm length devices, and even more significantly toward 0.12 µm and lower. The smaller the devices, the larger the effect of cross-dopants on properties such as threshold voltage, and the closer the devices, the less distance the dopants have to laterally travel to interfere with adjacent devices.

Problems are also created by the distribution of dopants in the implanted regions of the polysilicon 110. Advantageously, the concentration of the implanted, electrically active dopants in the final device should be as high as possible throughout the entire polysilicon layer and, in particular, near the underlying gate dielectric 108. Typically, however, after the implantation, the majority of dopants lie close to the top of the polysilicon 110, and an anneal is used to diffuse the dopants toward the gate dielectric 108. However, the anneal time and temperature required to diffuse the dopants across this distance will often undesirably allow diffusion of some of the dopants laterally within the polysilicon 110 into an oppositely-doped region of the polysilicon 110, causing cross-doping. This lateral diffusion within the polysilicon 110 is a problem regardless of whether a silicide layer is present. This mechanism of cross-doping is particularly problematic where half the distance between the active regions of adjacent devices becomes comparable to the thickness of the doped regions of the polysilicon 110. In addition, the use of thinner gate dielectric layers improves device: performance, but only where a relatively large concentration of dopants, advantageously about $10^{20}$ dopants/cm$^3$ or greater, is located adjacent to the gate dielectric (resulting in what is known in the art as low poly-depletion). If sufficient dopants are not located adjacent to the dielectric layer, the use of a thinner gate dielectric will at best only marginally improve device performance.

It is also possible for dopant distribution to cause problems when forming a refractory metal silicide by a salicide process. In a typical salicide process, a refractory metal is deposited after formation of a polysilicon gate structure, a source and drain, and silicon dioxide or silicon nitride spacers. The device is heated to react the metal with the exposed silicon, thereby forming a refractory metal silicide. Due to a low level of bonding between the refractory metal and the spacers, the silicide typically does not form on the spacers and the unreacted metal can be etched away, leading to what is conventionally known as self-alignment of the silicide structure. Growth of the gate silicide layer in such a salicide process is detrimentally affected if too many dopants, or dopant-based precipitates, are located in the top region of the polysilicon gate structure, where the gate silicide is formed. In addition, because the polysilicon region is typically thicker when using a salicide process, the dopant diffusion distance to the gate dielectric is often increased, thereby allowing encroachment of the underlying channel region that often leads to shorts in the device.

Applicant's copending U.S. patent application Ser. No. 08/902,044 describes a process for device fabrication which reduces the problems of cross-doping and undesirable concentration profiles. However an even greater reduction of these problems would be advantageous. The present invention achieves such reduction.

SUMMARY OF THE INVENTION

In accordance with the invention, a silicon gate field effect device is provided with improved control over the distribution of dopants by forming thin buried layer of oxide within the silicon gate. In essence, a silicon gate device is fabricated by the steps of forming a gate dielectric on a silicon substrate and forming a first layer of the silicon gate (amorphous or polycrystalline) on the dielectric. A thin layer of oxide is formed on the first gate layer, and a second silicon gate layer is formed on the oxide, producing a silicon gate containing a thin buried oxide layer. Dopants are then implanted through the second gate layer and the buried oxide, and the device is finished in a conventional manner. The buried oxide layer, acting as a sieve, maintains high dopant concentration near the interface between the gate and minimizes dopant outdiffusion through the gate.

BRIEF DESCRIPTION OF THE DRAWINGS

The advantages, nature and various additional features of the invention will appear more fully upon consideration of the illustrative embodiments now to be described in detail in connection with the accompanying drawings. In the drawings.

It is to be understood that these drawings are for purposes of illustrating the concepts of the invention and are not to scale.

DETAILED DESCRIPTION OF THE INVENTION

The invention relates to a process for fabricating silicon gate field-effect devices, particularly dual-gate CMOS devices. General principles and standard procedures fabrication of such device are found, for example, in Van Zant, *Microchip Fabrication*, 3d Ed., McGraw-Hill, 1997. It is expected that future processing technology will allow, for example, use of thinner layers and lower implantation energies in the process of the invention, and the concept of the invention is applicable to such future improvements.

Figure 1:
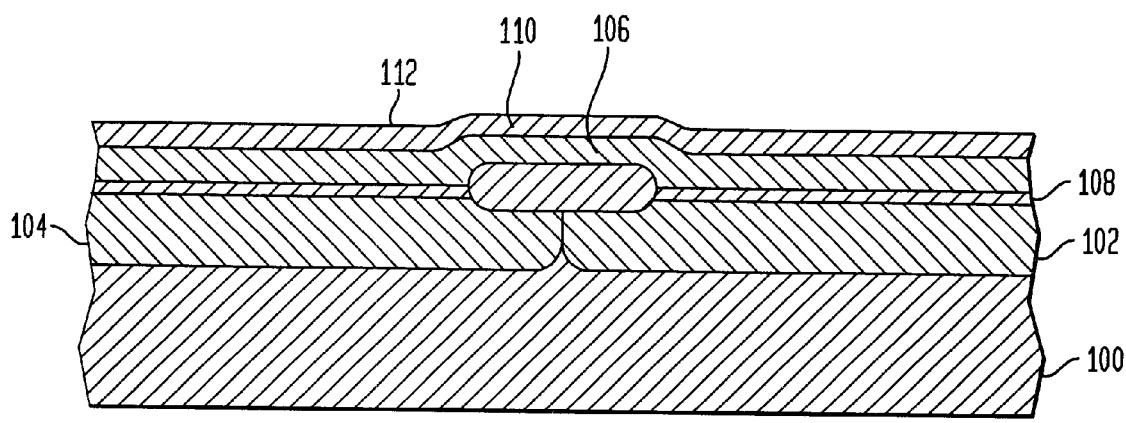
FIG. 1 illustrates a structure useful in explaining a typical prior art process for forming a dual-gate structure.
Figure 2:
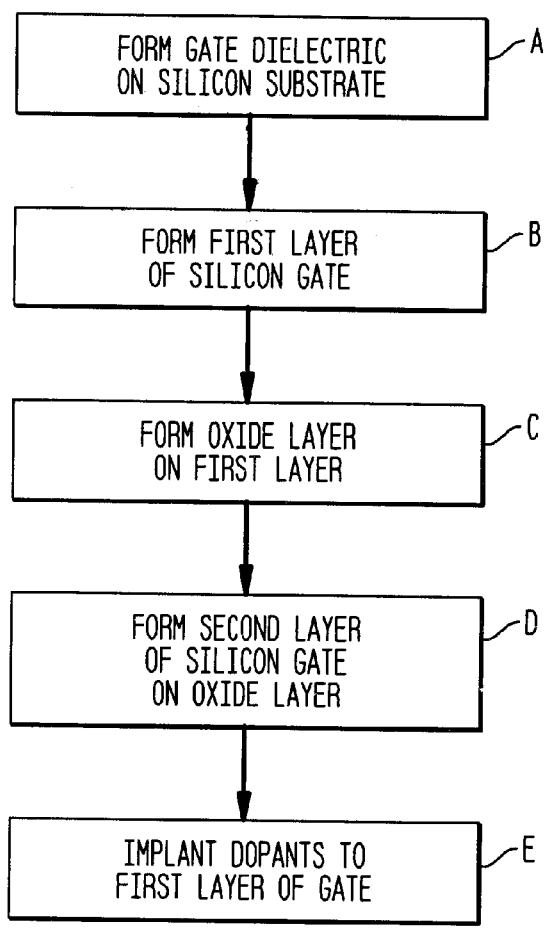
FIG. 2 is a schematic flow diagram illustrating the steps involved in making a field effect device in accordance with the invention.

Referring to the drawings, FIG. 2 is a schematic flow diagram showing the steps in making a silicon gate field effect device in accordance with the invention. The first step, shown in block A, is to form a silicon substrate having a gate dielectric on the working surface where the device is to fabricated.

Figure 3A:
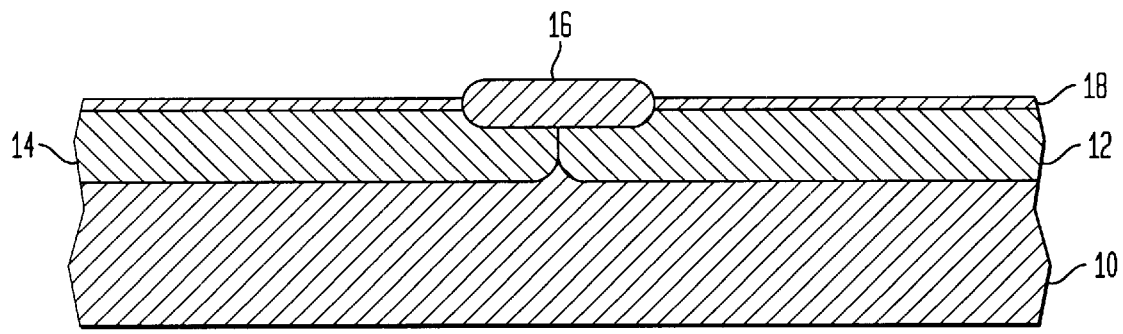
FIGS. 3A to 3F schematically illustrate an exemplary device at various stages of the FIG. 2 process.

FIG. 3A illustrates such a substrate comprising a semiconductor substrate 10 having an n-type region 12 and a p-type region 14. It is possible for these regions to be formed in accordance with standard processing techniques well known to one skilled in the art, such as the twin tub process described in U.S. Pat. No. 4,435,596 to Parillo et al., the disclosure of which is hereby incorporated by reference. A field dielectric 16 is formed on the substrate to separate the n-type region 12 and the p-type region 14, in accordance with standard processing techniques. Field dielectric 16 constitutes, for example, a surface isolation (e.g., LOCOS—localized oxidation of silicon) or a trench isolation (e.g., STI—shallow trench isolation). Typically, the field dielectric 16 is STI isolation and has a thickness of about 2000 to about 3000 Å.

A gate dielectric, region 18, typically silicon dioxide, is then formed over the portions of the n-type region 12 and p-type region 14 not covered by the field dielectric 16. The gate dielectric 18 is formed in accordance with standard processing techniques and, when formed from silicon dioxide, is advantageously about 15 to about 100 Å thick. It is possible to consider the combination of the field dielectric 16 and gate dielectric 18 as constituting a dielectric material region.

Figure 3B:
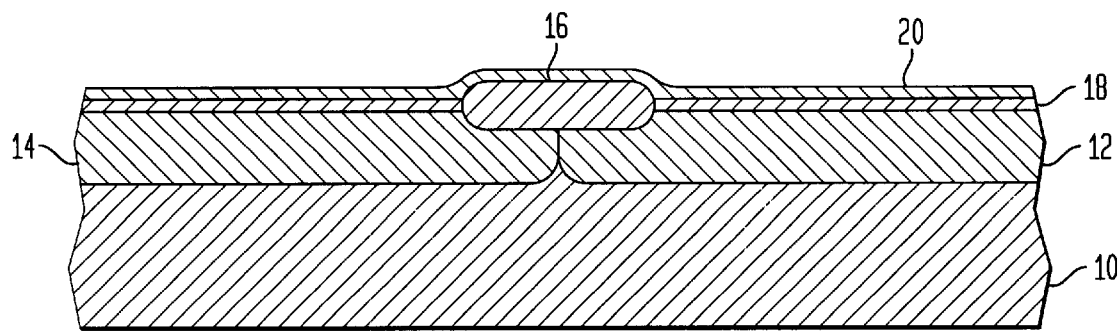

The next step shown in block B of FIG. 2 is to form a first region of the silicon gate on the gate dielectric. This is illustrated in FIG. 3(b) wherein a first region of amorphous silicon 20 is formed on the field dielectric 16 and gate dielectric 18. It is also possible to use polysilicon. Amorphous silicon is advantageous in that it substantially reduces channeling and therefore allows use of thinner layers. Advantageously, the amorphous region 20 has a thickness of about 300 to about 2000 Å. The region 20 is formed in accordance with standard processing techniques known in the art, e.g., chemical vapor deposition, as discussed, for example in Van Zant, supra, Chapter 12.

The third step shown in FIG. 2, Block C, is to form an oxide layer which will become a buried oxide layer in the finished gate. The buried oxide is grown simply by interrupting the deposition of the polysilicon or a-Si layer and leaking the oxygen gas into the furnace. A few minutes exposure of the silicon film to oxygen will typically result in the growth of a few monolayers (0.5–1.0 nm) of silicon oxide. The exact thickness will depend on the growth temperature, oxygen pressure and microstructure of the underlying silicon layer and is best determined experimentally.

Figure 3C:
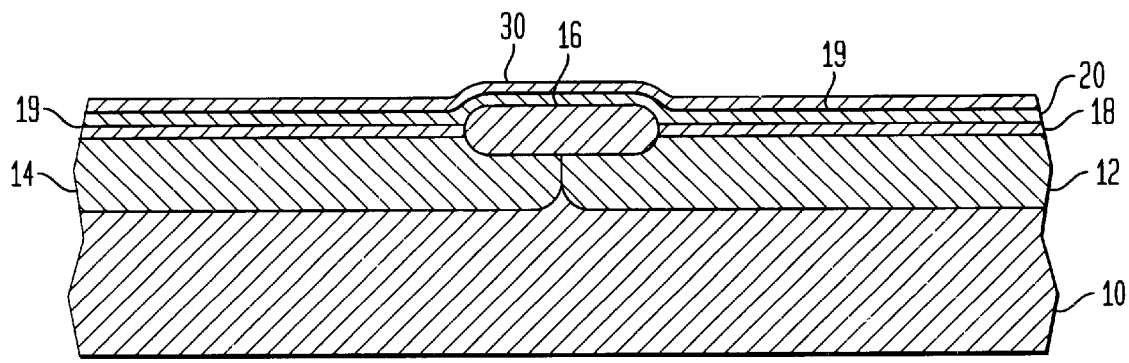

The next step (Block D) is to grow a second gate region over the oxide layer. It is also possible to use polysilicon. Amorphous silicon is advantageous because diffusion of dopants is generally slower in recrystallized amorphous silicon than in deposited polysilicon. FIG. 3C shows the thin oxide layer 19 and the second gate region 30 of amorphous silicon. Advantageously, the second amorphous region 30 has a thickness of about 50 to about 500 Å. It is preferably thinner than the first region 20. The second region 30 is formed in accordance with standard processing techniques well known in the art, e.g. chemical vapor deposition.

The fifth step, shown in Block E of FIG. 2 is to implant one or more dopants through the second silicon gate region and the oxide layer into the first silicon gate region. The gate dopants are then implanted selectively into the P- and NMOS regions of the wafer using standard lithographic techniques. The dopant implant energy has to be high enough for most dopants to penetrate the second gate region 30 and the buried oxide layer 19 but low enough to avoid dopant penetration through the gate dielectric layer 18 and into the device channel region. Given the total polysilicon layer thickness, this requirement imposes a limit on the maximum thickness of the second gate layer 30 and defines the range of dopant implant energies that will satisfy the penetration concerns. Specifically, for a total a-Si thickness of 100 nm, the maximum implant energies for B, As and P are 15, 40 and 20 keV, respectively. The implant peaks at these energies are at ~30, 27 and 25 nm, resulting in the acceptable layer 30 thickness of $\leq 20$ nm.

Figure 3D:
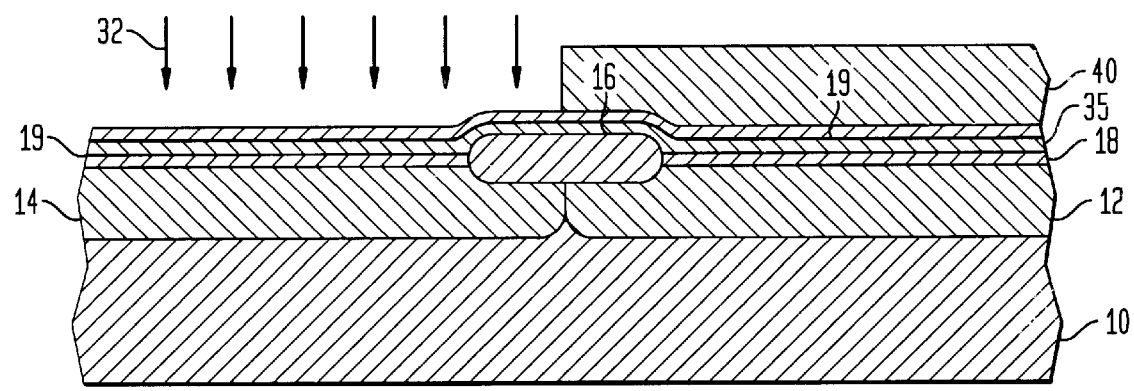

FIG. 3D is a simplified illustration of an exemplary doping step. A photoresist mask 40 is formed over the composite silicon gate 35, using standard lithographic techniques. The mask 40 selectively exposes portions of the gate 35 that overlay the p-type region 14 of the substrate 10. An n-type dopant 32 is implanted into the exposed portions of the gate 35. Suitable n-type dopants include arsenic and phosphorus.

Arsenic (As) can typically be implanted by ion implantation at about 2 to about 30 KeV. A typical dosage is about 1.5×10$^{15}$ to about 5×10$^{15}$ atoms/cm$^2$. Phosphorous is typically implanted at about 1 to about 20 KeV at a dosage of about 3×10$^{15}$ to about 8×10$^{15}$ atoms/cm$^2$.

Figure 3E:
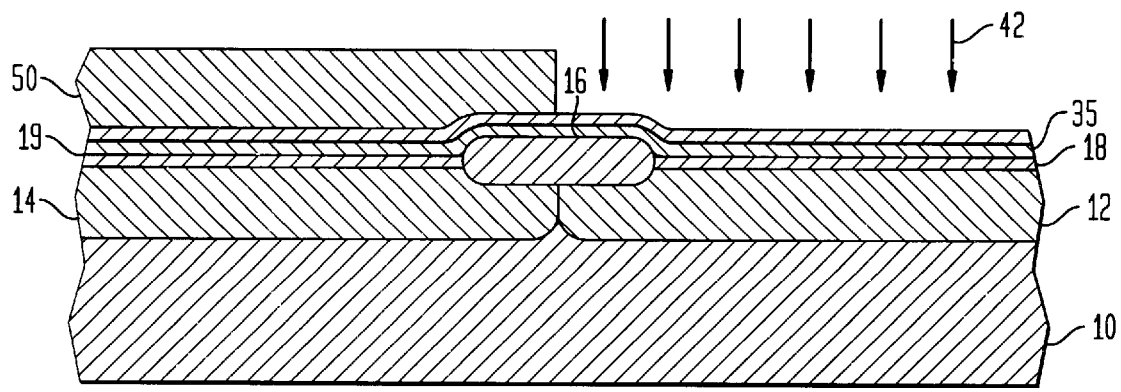

The mask 40 is then removed. Again using standard lithographic techniques, a second mask 50, as shown in FIG. 3E, is formed over the silicon gate region 35. The mask 50 selectively exposes portions of the region 30 that overlay the n-type region 12 of the substrate 10. A p-type dopant 42 is implanted into the exposed portions of the region 20. Suitable p-type dopants include boron. The implantation of the p-type dopant is also advantageously performed by ion implantation. Boron (B) is typically implanted at about 0.25 to about 8 KeV. A typical dosage is about 1.5×10$^{15}$ to about 4×10$^{15}$ atoms/cm$^2$.

The energy and dopant dose selected for both n-type and p-type dopants depend in part on the thickness of the silicon gate 35. In general, it is possible to use higher implant energies and doses with thicker layers without resulting in unwanted penetration.

Figure 3F:
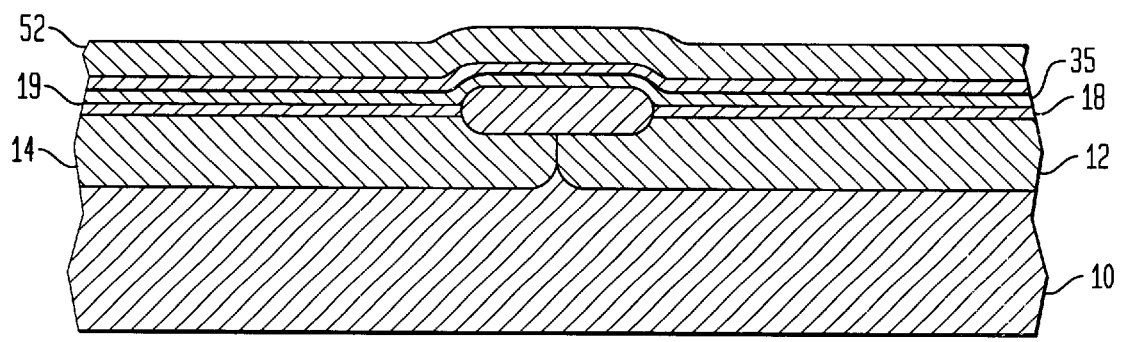

The field effect device is then finished in a conventional manner. As shown in FIG. 3F, a refractory metal silicide layer 52 is optionally formed on the gate 35 by standard processing techniques known to one skilled in the art, e.g., sputtering or chemical vapor deposition. Examples of suitable refractory metal suicides include tungsten silicide, tantalum silicide, and cobalt silicide. Advantageously, the refractory metal silicide layer 52 has a thickness of about 400 to about 1200 Å. It is also advantageous for the process of the invention to include a step of introducing nitrogen into the refractory metal silicide layer. Where the nitrogen is ion implanted, the implantation advantageously is performed at an energy of about 10–50 keV (depending on the thickness), more advantageously 30 keV, and at a dopant implant dose of about 1×10$^{15}$ to about 2×10$^{15}$ atoms/cm$^2$. The nitrogen appears to trap boron atoms in the silicide layer, and thus assists in reducing lateral diffusion and cross-doping of boron.

It is also possible to form a silicide layer by a salicide process. Metal layers other than refractory metal silicides are also possible.

Advantageously, an anneal is performed after formation of the second amorphous silicon region 30 to recrystallize the second amorphous silicon region 30 and the first amorphous silicon region 20, i.e., transform the regions 30, 20 into polysilicon. It is possible for the anneal to be performed after formation of the second silicon region 30, after formation of the silicide layer 52, or after a nitrogen implant of the silicide layer 52. The anneal is advantageously performed at a temperature of about 580 to about 650° C., for about 1 to about 5 hours, in a nitrogen atmosphere. More advantageously, the anneal is performed at about 650° C. for about 3 hours in a nitrogen atmosphere.

The resulting structure is then subjected to processing steps to form gate stacks over the n-regions and p-regions of the substrate, in accordance with standard procedures known to one skilled in the art. Advantageously, such steps include a rapid thermal anneal after formation of gate stacks. The rapid thermal anneal is advantageously performed such that the wafer is raised to a temperature of about 900 to about 1100° C. for a time of less than 1 second (spike anneal) to about 10 seconds. More advantageously, the wafer is raised to a temperature of 1000° C. for 5 seconds. The rapid thermal anneal is useful in attaining a desirable distribution of dopants in the doped regions of the device and in helping to activate the dopants.

It should be noted that the buried oxide layer 19 will break up during the high temperature activation anneal and, indeed, may be discontinuous already in the as-grown state. The main purpose of the oxide is to act as a sieve to reduce the dopant flux into the silicide layer. An additional benefit provided by this oxide in the polycide and salicide gate structures is in the improved control of the grain growth across the silicide/polysilicon interface and alleviating "spiking".

Typical processing steps subsequent to formation and implantation of refractory silicide layer 52 would include the following:

Deposit of a gate hard mask. The mask is formed, for example, from silicon oxide deposited by plasma-enhanced deposition of tetraethyl orthosilicate (PETEOS), a nitride layer formed by plasma-enhanced chemical vapor deposition (PECVD), or a spin-on glass (SOG) layer;

Formation of a gate photoresist to allow selective etching of the gate hard mask, etching of the hard mask, and removal of the photoresist;

Etching of refractory silicide layer 52 and first and second silicon regions 20, 30;

Formation of a photoresist to allow implantation of low-doped n and p source/drain extension regions (LDD), implanting of the LDD, and removal of the photoresist;

Deposit of a dielectric, e.g., silicon oxide by PETEOS, for gate spacer formation, anneal of the dielectric, and etch of the spacers;

Formation of a photoresist to allow implantation of n-type source and drain, implanting the n-type source and drain, and removal of the photoresist;

Formation of a photoresist to allow implantation of p-type source and drain, implanting the p-type source and drain, and removal of the photoresist.

The rapid thermal anneal is advantageously performed subsequent to implantation of the p-type source and drain. Where a salicide process is used, the process is typically performed subsequent to formation of the n-type and p-Bevk type source and drain, and the rapid thermal anneal is typically performed prior to depositing the refractory metal on the polysilicon gate structure and source/drain contacts.

It is to be understood that the above-described embodiments are illustrative of only a few of the many possible specific embodiments which can represent applications of the principles of the invention. Numerous and varied other arrangements can be readily devised by those skilled in the art without departing from the spirit and scope of the invention.

What is claimed is:

1. A process for device fabrication, comprising the steps of:
   forming a gate dielectric region on a silicon substrate;
   forming a first silicon gate layer on the gate dielectric;
   forming on the first silicon gate layer an oxide layer having a thickness in the range 0.5–1.0 nm;
   forming a second silicon gate layer on the oxide layer; and
   implanting one or more dopants through the second silicon gate layer and the oxide layer into the first silicon gate layer.

2. The process of claim 1 wherein the first silicon gate layer has a thickness in the range 300–2000 angstroms.

3. The process of claim 1 wherein the second gate layer has a thickness in the range 50–500 angstroms.

4. The process of claim 1, wherein the implantation step comprises implanting an n-type dopant in a first region of the silicon gate and implanting a p-type dopant in a second region of the silicon gate.

5. The process of claim 4, wherein the p-type dopant is boron.

6. The process of claim 5, wherein the boron is implanted by ion implantation at about 0.25 to about 8 keV.

7. The process of claim 6, wherein the implantation is performed at a dosage of about $1.5 \times 10^{15}$ to about $4 \times 10^{15}$ atoms/cm$^2$.

8. The process of claim 4, wherein the first region overlies a p-type region of the silicon substrate and the second region overlies an n-type region of the silicon substrate.

9. The process of claim 4, wherein the n-type dopant is selected from arsenic and phosphorus.

10. The process of claim 9, wherein the n-type dopant is arsenic and the arsenic is implanted by ion implantation at about 2 to about 30 keV.

11. The process of claim 10, wherein the implantation is performed at a dosage of about $1.5 \times 10^{15}$ to about $5 \times 10^{15}$ atoms/cm$^2$.

12. Thee process of claim 9, wherein the n-type dopant is phosphorus and the phosphorus is implanted by ion implantation at about 1 to about 20 keV.

13. The process of claim 12, wherein the implantation is performed at a dosage of about $3 \times 10^{15}$ to about $8 \times 10^{15}$ atoms/cm$^2$.

14. The process of claim 1, wherein the first and second silicon gate layers are amorphous silicon.

15. The process of claim 1, further comprising the step of forming a refractory metal silicide on at least a portion of the silicon gate.

16. The process of claim 15, further comprising introducing nitrogen into the refractory metal silicide.

17. The process of claim 16, wherein the nitrogen is ion implanted at about 10 to about 50 keV and at a dose of about $1 \times 10^{15}$ to about $2 \times 10^{15}$ atoms/cm$^2$.

18. The process of claim 15, wherein the refractory metal silicide is selected from tungsten silicide, tantalum silicide, and cobalt silicide.

19. The process of claim 1, further comprising the step of performing an anneal subsequent to forming the silicon gate.

20. The process of claim 1, wherein the first silicon gate layer is amorphous silicon and has a thickness of about 300 to about 2000 Å.

21. The process of claim 1, wherein the second amorphous silicon or polysilicon region is amorphous silicon and has a thickness of about 50 to about 500 Å.

22. The process of claim 1, further comprising a step of performing a rapid thermal anneal at a temperature of about 900 to about 1100° C.

23. A process for device fabrication, comprising the steps of:
   forming a gate dielectric region on a silicon substrate;
   forming a first silicon gate layer on the gate dielectric;
   forming an oxide layer on the first silicon gate layer;
   forming a second silicon gate layer on the oxide layer;
   implanting one or more dopants through the silicon gate layer and the oxide layer into the first silicon gate layer; and
   performing an anneal at a temperature of about 580 to about 650° C., for about 1 to about 5 hours.

24. A process for device fabrication, comprising the steps of:
   forming a gate dielectric region on a silicon substrate;
   forming a first silicon gate layer on the gate dielectric;
   forming on the first silicon gate layer an oxide layer having a thickness in the range 0.5–1.0 nm;
   forming a second silicon gate layer on the oxide layer; and
   implanting one or more dopants through the second silicon gate layer and the oxide layer into the first silicon gate layer;
   wherein the implanting comprises implanting an n-type dopant in a first region of the silicon gate and implanting a p-type dopant in a second region of the silicon gate, the p-type dopant comprising boron implanted at about 0.25 to about 8 KeV for a time of about 5 minutes or less.

* * * * *